(12) United States Patent
Cao et al.

(10) Patent No.: US 9,835,921 B2
(45) Date of Patent: Dec. 5, 2017

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Zhanfeng Cao, Beijing (CN); Luke Ding, Beijing (CN); Wenlin Zhang, Beijing (CN); Xiangchun Kong, Beijing (CN); Feng Zhang, Beijing (CN); Qi Yao, Beijing (CN); Zhixing Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 267 days.

(21) Appl. No.: 14/436,004

(22) PCT Filed: Sep. 18, 2014

(86) PCT No.: PCT/CN2014/086809
§ 371 (c)(1),
(2) Date: Apr. 15, 2015

(87) PCT Pub. No.: WO2015/180302
PCT Pub. Date: Dec. 3, 2015

(65) Prior Publication Data
US 2017/0139246 A1 May 18, 2017

(30) Foreign Application Priority Data
May 26, 2014 (CN) .......................... 2014 1 0224631

(51) Int. Cl.
*H01L 27/14* (2006.01)
*H01L 29/04* (2006.01)
(Continued)

(52) U.S. Cl.
CPC ........ *G02F 1/1368* (2013.01); *G02F 1/13439* (2013.01); *G02F 1/133345* (2013.01);
(Continued)

(58) Field of Classification Search
CPC ... H01L 27/127; H01L 27/124; G02F 1/1368; G02F 1/13439; G02F 1/136286;
(Continued)

(56) References Cited

U.S. PATENT DOCUMENTS 9,425,219 B2 * 8/2016 Shi .................. G09G 3/3648
2005/0142680 A1 * 6/2005 Ha .................. G02F 1/136227
438/30
(Continued)

FOREIGN PATENT DOCUMENTS

CN 101145561 A 3/2008
CN 102655117 A 9/2012
(Continued)

OTHER PUBLICATIONS

Aug. 16, 2016—(CN)—Second Office Action Appn 201410224631.1 with English Tran.
(Continued)

*Primary Examiner* — Victor A Mandala
(74) *Attorney, Agent, or Firm* — Banner & Witcoff, Ltd.

(57) ABSTRACT

An array substrate, a manufacturing method thereof and a display device are disclosed. The array substrate comprises a plurality of pixel unit regions each including a thin-film transistor (TFTs) and a pixel electrode. A first insulating layer provided with a first through hole and a second through hole is formed between an active layer of the TFT and the pixel electrode. A source electrode of the TFT is connected with the active layer through the first through hole. A drain electrode of the TFT is lapped onto the pixel electrode and connected with the active layer through the second through
(Continued)

hole. The array substrate can prevent the oxidization of metal such as copper in the process of patterning a transparent conductive film.

20 Claims, 6 Drawing Sheets

(51) Int. Cl.
| | | |
|---|---|---|
| H01L 29/15 | (2006.01) | |
| H01L 31/036 | (2006.01) | |
| G02F 1/1368 | (2006.01) | |
| G02F 1/1362 | (2006.01) | |
| G02F 1/1333 | (2006.01) | |
| G02F 1/1343 | (2006.01) | |
| H01L 27/12 | (2006.01) | |

(52) U.S. Cl.
CPC .. *G02F 1/134309* (2013.01); *G02F 1/136209* (2013.01); *G02F 1/136227* (2013.01); *G02F 1/136286* (2013.01); *H01L 27/124* (2013.01); *H01L 27/127* (2013.01); *G02F 2001/136222* (2013.01); *G02F 2201/121* (2013.01); *G02F 2201/123* (2013.01)

(58) Field of Classification Search
CPC ......... G02F 1/133345; G02F 1/136209; G02F 1/136227; G02F 1/134309; G02F 2001/136222; G02F 2201/123; G02F 2201/121
See application file for complete search history.

(56) References Cited

U.S. PATENT DOCUMENTS

| | | | | |
|---|---|---|---|---|
| 2007/0103608 | A1* | 5/2007 | Lee | G02F 1/13454 349/38 |
| 2011/0024750 | A1* | 2/2011 | Yamazaki | H01L 27/1214 257/57 |
| 2011/0084267 | A1* | 4/2011 | Yamazaki | H01L 21/76828 257/43 |
| 2011/0227851 | A1* | 9/2011 | Oh | G02F 1/13338 345/173 |
| 2011/0228189 | A1* | 9/2011 | Oh | G02F 1/13338 349/43 |
| 2012/0268396 | A1* | 10/2012 | Kim | G06F 3/0412 345/173 |
| 2014/0061635 | A1* | 3/2014 | Liu | H01L 29/66765 257/43 |
| 2014/0118656 | A1* | 5/2014 | Jang | G02F 1/133528 349/44 |
| 2014/0138685 | A1* | 5/2014 | Zhang | H01L 22/32 257/48 |
| 2014/0209897 | A1* | 7/2014 | Kubota | H01L 29/41733 257/43 |
| 2015/0221680 | A1* | 8/2015 | Nakata | G02F 1/136204 349/40 |

FOREIGN PATENT DOCUMENTS

| | | |
|---|---|---|
| CN | 102709239 A | 10/2012 |
| CN | 103474437 A | 12/2013 |
| CN | 104020621 A | 9/2014 |
| WO | 9413019 A1 | 6/1994 |

OTHER PUBLICATIONS

Jan. 28, 2015—International Search Report and Written Opinion with Eng Tran.
Mar. 2, 2016—(CN)—First Office Action Appn 201410224631.1 with English Tran.

* cited by examiner

ARRAY SUBSTRATE, MANUFACTURING METHOD THEREOF AND DISPLAY DEVICE

The application is a U.S. National Phase Entry of International Application No. PCT/CN2014/086809 filed on Sep. 18, 2014, designating the United States of America and claiming priority to Chinese Patent Application No. 201410224631.1 filed on May 26, 2014. The present application claims priority to and the benefit of the above-identified applications and the above-identified applications are incorporated by reference herein in their entirety.

TECHNICAL FIELD

At least one embodiment of the present invention relates to an array substrate, a manufacturing method thereof and a display device.

BACKGROUND

Liquid crystal displays (LCDs) are widely applied in various fields such as computers, mobile phones, TV sets and measurement instruments display due to the advantages of low working voltage, low power consumption, flexible display mode, low radiation and the like. The LCD may comprise an LCD panel. The LCD panel comprises an array substrate provided with thin-film transistors (TFTs), a color filter (CF) substrate arranged in cell-assembly with the array substrate, and a liquid crystal layer interposed between the two substrates. In the working process of the LCD, liquid crystal molecules in the liquid crystal layer are driven by electric fields generated between pixel electrodes on the array substrate and common electrode(s) on the CF substrate, so that the liquid crystal molecules at various positions in the liquid crystal layer have different deflection angles, and the LCD can achieve display.

SUMMARY

At least one embodiment of the present invention provides an array substrate, a manufacturing method thereof and a display device to prevent the oxidization of metal such as copper in the process of patterning a transparent conductive film and ensure the conductivity of source electrodes and drain electrodes.

At least one embodiment of the present invention provides an array substrate, which comprises a plurality of pixel unit regions arranged in an array. The pixel unit regions each include a TFT and a pixel electrode; a first insulating layer is formed between an active layer of the TFT and the pixel electrode and provided with a first through hole and a second through hole which respectively correspond to both ends of the active layer; a source electrode of the TFT is connected with the active layer through the first through hole; and a drain electrode of the TFT is lapped onto the pixel electrode and connected with the active layer through the second through hole.

At least one embodiment of the present invention provides a display device, which comprises the foregoing array substrate.

At least one embodiment of the present invention provides a method for manufacturing an array substrate. The method comprises: forming patterns of an active layer of a TFT, a first insulating layer and a pixel electrode, in which the first insulating layer is provided with a first through hole and a second through hole which respectively correspond to both ends of the active layer; and forming patterns of a source electrode and a drain electrode of the TFT, in which the source electrode of the TFT is connected with the active layer through the first through hole and the drain electrode of the TFT is lapped onto the pixel electrode and connected with the active layer through the second through hole.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

1—Base Substrate; 2—TFT; 21—Active Layer; 22—Gate Electrode; 23—Gate Insulating Layer; 24—Source Electrode;
25—Drain Electrode; 3—Pixel Electrode; 4—First Insulating Layer;
5—First Through Hole; 6—Second Through Hole; 7—Data Line;

8—Gate Line; 9—Second Insulating Layer; 10—Common Electrode;
11—black matrix; 12—Color filter; 13—Transparent Conductive Film;
14—Photoresist Layer; 141—Full Exposure Area; 142—Non-exposure Area;
143—Partial Exposure Area; 15—First Transparent Conductive Portion;
16—Second Transparent Conductive Portion; 17—Gap

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventors have noted that: in the process of forming layer structures of an array substrate, structures such as a source electrode and a drain electrode may be formed with a metal such as copper at first, and the a transparent conductive film is formed and patterned to form a pixel electrode. In the process of patterning the transparent conductive film, because the structures such as the source electrode and the drain electrode made from the metal such as copper are exposed, the metal surface tends to be oxidized. Moreover, the thickness of an oxide layer on the metal surface may be continuously increased as time lapses. When the thickness of the oxide layer is relatively large, the conductivity of the source electrode and the drain electrode may be disadvantageously affected, and the array substrate may not work properly. Thus, the yield of products can be affected and the user experience can be reduced.

Figure 1:
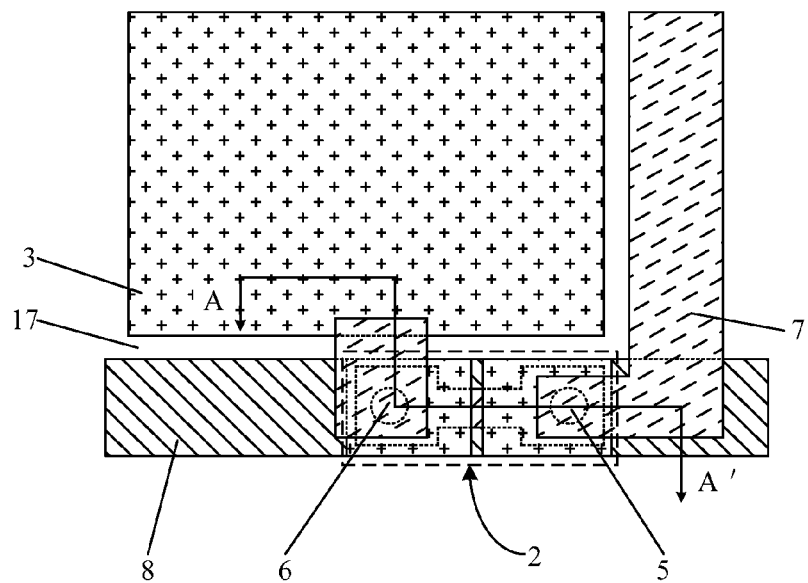
FIG. 1 is a plan view 1 of an array substrate provided by an embodiment of the present invention.
Figure 2:
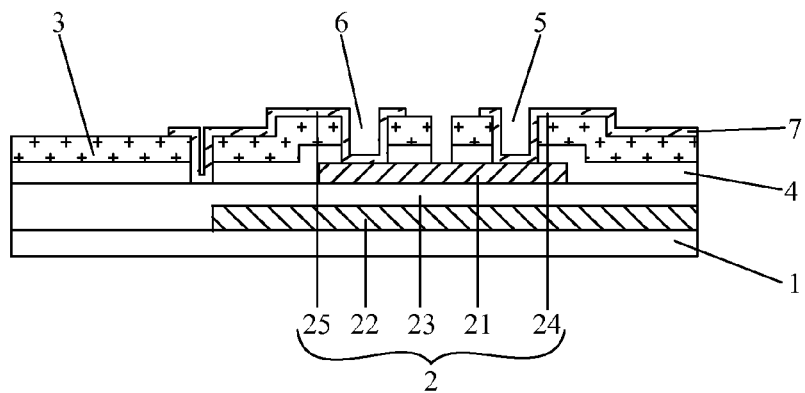
FIG. 2 is an A-A' sectional view of FIG. 1.

At least one embodiment of the present invention provides an array substrate. As illustrated in FIGS. 1 and 2, the array substrate comprises a plurality of pixel unit regions arranged in an array. The pixel unit region each includes a thin film transistor (TFT) 2 and a pixel electrode 3. A first insulating layer 4 is formed between an active layer 21 of the TFT 2 and the pixel electrode 3 and provided therein with a first through hole 5 and a second through hole 6, which respectively correspond to both ends of the active layer 21. A source electrode 24 of the TFT 2 is connected with the active layer 21 through the first through hole 5. A drain electrode 25 of the TFT 2 is lapped onto the pixel electrode 3 and connected with the active layer 21 through the second through hole 6.

Herein, a source region and a drain region of the active layer are respectively exposed by the first through hole 5 and the second through hole 6; the source electrode 24 of the TFT 2 is electrically connected with the active layer 21 through the first through hole 5; and the drain electrode 25 of the TFT 2 is electrically connected with the active layer 21 through the second through hole 6.

Obviously, in the embodiment of the present invention, as the drain electrode of the TFT is lapped onto the pixel electrode and connected with the active layer through the second through hole, the pixel electrode can be formed at first, and then the source electrode and the drain electrode are formed, which prevents the undesirable phenomena such as the oxidization of the structures such as the source electrode and the drain electrode due to the exposure of the structures such as the source electrode and the drain electrode made from a metal such as copper in the process of forming the pixel electrode after forming the source electrode and the drain electrode, guarantees the conductivity of the source electrode and the drain electrode, and the guarantees the normal operation of the array substrate, the yield of products and the user experience.

Obviously, as illustrated in FIGS. 1 and 2, the array substrate further comprises data lines 7 and gate lines 8. The data lines 7 are extended in the vertical direction; the gate lines 8 are extended in the horizontal direction; the data lines 7 and the gate lines 8 are intercrossed with each other to define pixel units. In one embodiment, the data lines 7 and the source electrodes 24 and the drain electrodes 25 of the TFTs 2 may be disposed on the same layer, namely the data lines 7, the source electrodes 24 and the drain electrodes 25 may be formed in the same patterning process. At this point, the data lines 7, the source electrodes 24 and the drain electrodes 25 are all formed after the pixel electrodes 3 are formed, so that the oxidization of the structures such as the data lines 7, the source electrodes 24 and the drain electrodes 25 in the process of forming the pixel electrodes 3 can be prevented.

It should be noted that: before the process of forming the patterns of the active layers 21, the first insulating layer 4 and the pixel electrodes 3, as illustrated in FIGS. 1 and 2, the structures such as the gate lines 8 (not shown in FIG. 2), the gate electrodes 22 of the TFTs 2 integrally formed with the gate lines 8, and a gate insulating layer 23 may be formed on a base substrate 1 of the array substrate.

Figure 3:
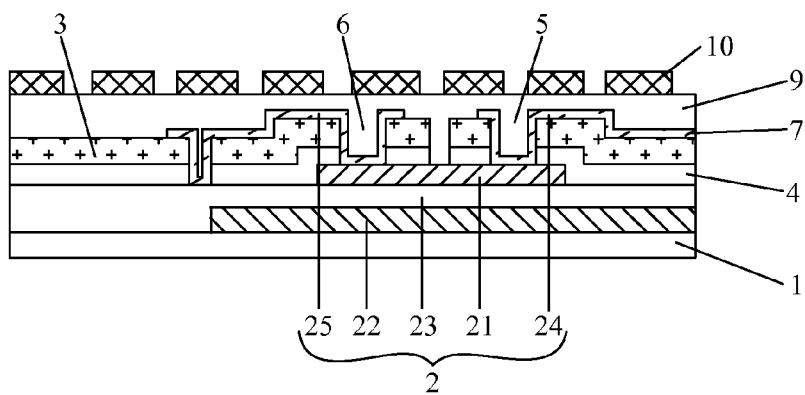
FIG. 3 is a schematic structural view 1 of the array substrate provided by an embodiment of the present invention.

Obviously, the array substrate as shown in FIGS. 1 and 2 may be a twisted nematic (TN) array substrate. On this basis, the structure of the array substrate as shown in FIG. 2 may be modified. For instance, as illustrated in FIG. 3, the array substrate may further comprise a second insulating layer 9 and a common electrode 10 disposed above the pixel electrode 3 on the basis of the array substrate as shown in FIG. 2. The second insulating layer 9 is disposed between the common electrode 10 and the pixel electrode 3, so that the insulation between the common electrode 10 and the pixel electrode 3 can be guaranteed. Thus, a certain voltage difference can be produced between the common electrode 10 and the pixel electrode 3, and an electric field can be formed to drive the deflection of liquid crystal molecules. At this point, the array substrate is an advanced super dimension switch (ADS) array substrate.

The key technical characteristics of the ADS technology are described as follows: a multi-dimensional electric field is formed by electric fields produced on edges of slit electrodes in the same plane and electric fields produced between a slit electrode layer and a plate electrode layer, so that liquid crystal molecules in all the alignments over electrodes and between slit electrodes in a liquid crystal cell can rotate, and the working efficiency of the liquid crystals and the transmittance can be improved. The ADS technology can improve the image quality of thin-film transistor liquid crystal display (TFT-LCD) products and has the advantages of high resolution, high transmittance, low power consumption, wide viewing angle, high aperture opening ratio, low color difference, no push Mura, etc. The improvements of the ADS technology include high-transmittance I-ADS technology, high-aperture-opening-ratio H-ADS technology, high-resolution S-ADS technology and the like as for different applications.

In order to ensure that a multi-dimensional electric field can be formed between the common electrode 10 and the pixel electrode 3, in one embodiment, the common electrode 10 in FIG. 3 may be a slit electrode and the pixel electrode 3 may be a plate electrode.

In one embodiment, the common electrode 10 and the second insulating layer 9 may be disposed below the pixel electrode 3. For instance, as illustrated in FIG. 4, the array substrate may further comprise a second insulating layer 9 and a common electrode 10 disposed below the TFT 2, namely the structures such as the common electrode 10, the second insulating layer 9, the gate line 8 (not shown in FIG. 4) and the gate electrode 22 arranged on the same layer, the gate insulating layer 23, the TFT 2 and the data line 7 may be sequentially arranged on the base substrate 1 of the array substrate from the bottom up.

Figure 4:
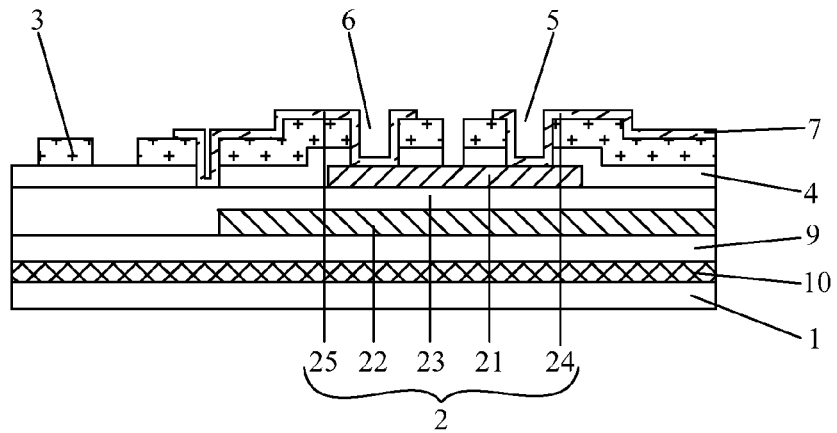
FIG. 4 is a schematic structural view 2 of the array substrate provided by an embodiment of the present invention.

At this point, in order to ensure that a multi-dimensional electric field can be formed between the common electrode 10 and the pixel electrode 3, in one embodiment, the common electrode 10 in FIG. 4 may be a plate electrode and the pixel electrode 3 may be a slit electrode.

Because people have higher and higher requirements on the transmittance, resolution, power consumption and the like of display devices in recent years, all the display devices are developed towards high transmittance, high resolution, low power consumption, etc. When the resolution of the display device becomes higher, the size of each pixel unit is smaller. When the side length of the pixel unit is converted from dozens of micrometers to a dozen of micrometers, obviously, the size of the pixel unit is greatly reduced. At this point, if the width of black matrixes for dividing the pixel units is still unchanged, compared with the pixel units, the black matrixes will become notable, and the display effect of the display device can be undesirably affected. Therefore, the width of the black matrixess can be correspondingly reduced to ensure the display effect of the display device. Subsequently, color filters are formed above display regions of corresponding pixel units defined by the black matrixess.

However, the reduced width of the black matrixes may result in the deviation of the cell-assembly between the array substrate and the CF substrate, and the undesirable phenomena such as light leakage can be produced. Thus, the width of black matrixes on the CF substrate cannot be randomly reduced. In order to avoid the undesirable phenomena such as light leakage due to the reduced size of the black matrixes, both the black matrixes and the CFs may be formed on the array substrate. Because the black matrixes are disposed on the array substrate, when the width of the black matrixes is appropriately reduced, the black matrixes not only can fully shield the structures, where light shielding is required, such as the gate lines, the data lines and the TFTs, but also can reduce the possibility of the light leakage phenomenon, and the not only the resolution and the transmittance can be improved but also the display effect of the display device can be guaranteed. The technology is also referred to as color filter on array (COA) technology.

Figure 5:
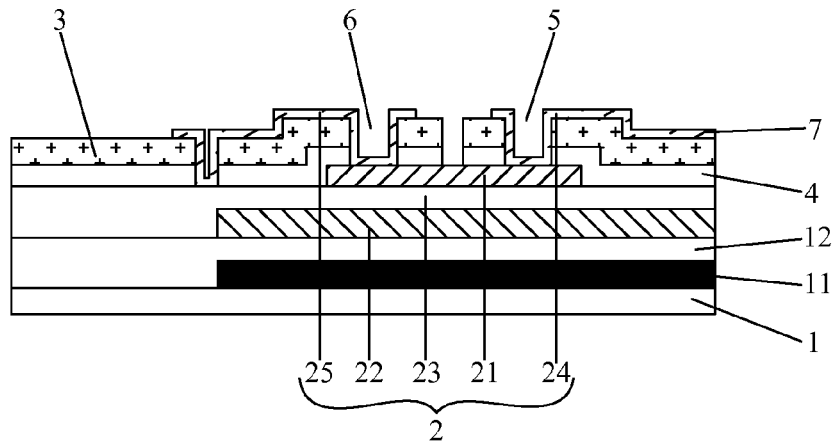
FIG. 5 is a schematic structural view 3 of the array substrate provided by an embodiment of the present invention.
Figure 6:
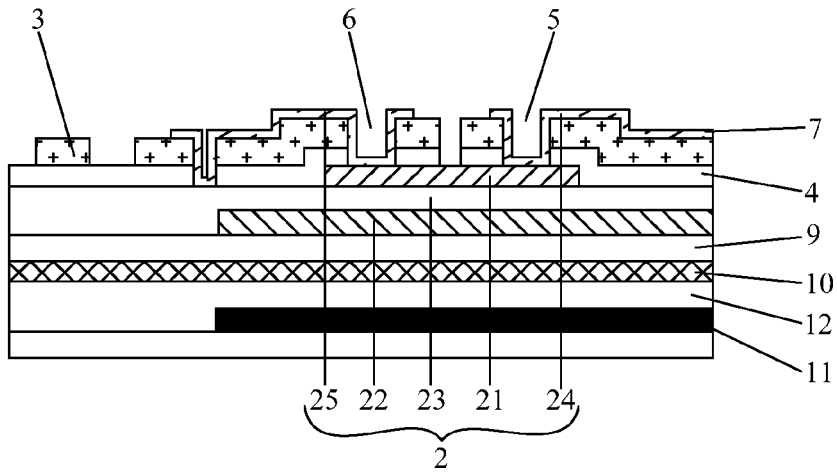
FIG. 6 is a schematic structural view 4 of the array substrate provided by an embodiment of the present invention.

In one embodiment of the present invention, as illustrated in FIG. 5, black matrixes 11 and color filters 12 may be formed on the base substrate 1 and below the structures formed in FIG. 2 to form a COA array substrate. In one embodiment, as illustrated in FIG. 6, black matrixes 11 and color filters 12 may also be formed on the base substrate 1 and below the layer structures of the array substrate as shown in FIG. 4 to form a COA-ADS array substrate. No further description will be given here. In another embodiment, black matrixes and color filters may also be formed on an upper layer of the array substrate. The black matrixes are formed by, for instance, corresponding to the gate lines, the data lines and the TFTs, and color filter units are formed each corresponding to a pixel unit and, for instance, include red, green and blue (RGB) color filter units.

In different embodiments, the structures such as the first insulating layer 4, the gate insulating layer 23 and the second insulating layer 9 may all be made from an insulating material such as silicon oxide, silicon nitride, hafnium oxide and resin.

At least one embodiment of the present invention further provides a display device, which comprises any foregoing array substrate. For instance, the display device may be any product or component with display function such as LCD panel, E-paper, organic light-emitting diode (OLED) panel, LCD TV, LCD, digital picture frame, mobile phone, tablet PC and the like.

The LCD device provided by an embodiment of the present invention comprises an array substrate and an opposing substrate which are subjected to cell-assembly to form a liquid crystal cell which is filled with liquid crystal materials. The opposing substrate is, for instance, a color filter (CF) substrate. When the array substrate is a COA substrate, black matrixes and color filters may be not formed on the opposing substrate again. In some embodiments, an LCD device further comprises a backlight configured to provide backlight for the array substrate.

Figure 7:
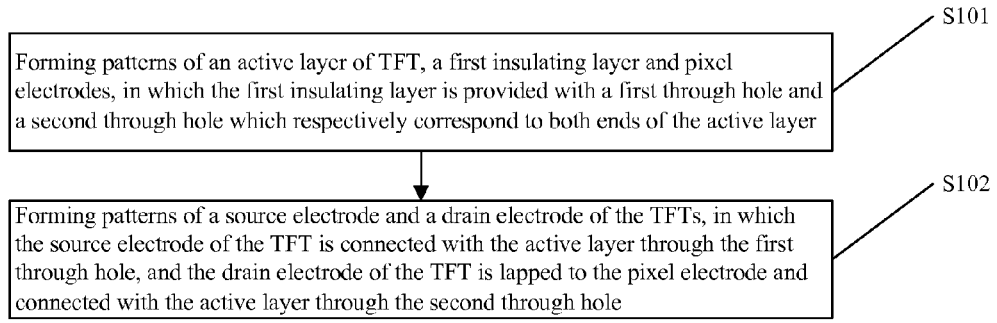
FIG. 7 is a flowchart 1 of a method for manufacturing an array substrate provided by an embodiment of the present invention.

At least one embodiment of the present invention further provides a method for manufacturing an array substrate. As illustrated in FIG. 7, the manufacturing method comprises the following steps.

Step S101: forming patterns of an active layer of a TFT, a first insulating layer and a pixel electrode. The first insulating layer is provided with a first through hole and a second through hole which respectively correspond to both ends of the active layer.

Step S102: forming patterns of a source electrode and a drain electrode of the TFT. The source electrode of the TFT is connected with the active layer through the first through hole, and the drain electrode of the TFT is lapped onto the pixel electrode and connected with the active layer through the second through hole.

Obviously, in the technical solution of the embodiment of the present invention, the method of forming the pixel electrode at first and then forming the patterns of the source electrode and the drain electrode can effectively prevent the undesirable phenomena such as the oxidization of the structures such as the source electrode and the drain electrode due to the exposure of the structures such as the source electrode and the drain electrode made from a metal such as copper in the process of forming the pixel electrode after forming the source electrode and the drain electrode, guarantee the conductivity of the source electrode and the drain electrode, and the guarantee the normal operation of the array substrate, the yield of products and the user experience.

Figure 8:
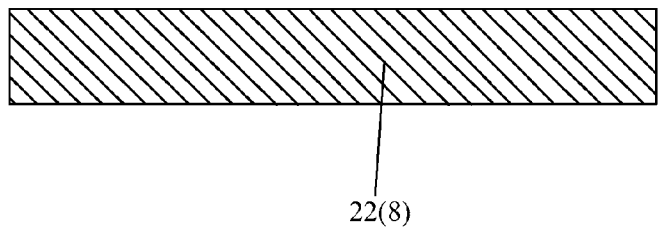
FIG. 8 is a plan view 2 of the array substrate provided by an embodiment of the present invention.

Obviously, before the step S101, as illustrated in FIG. 8, a gate insulating layer 23 and the structures such as a gate line 8 and a gate electrode 22 on the same layer may be formed on the array substrate at first. The gate insulating layer 23 is a transparent insulating layer structure and is not shown in FIG. 8.

Figure 9:
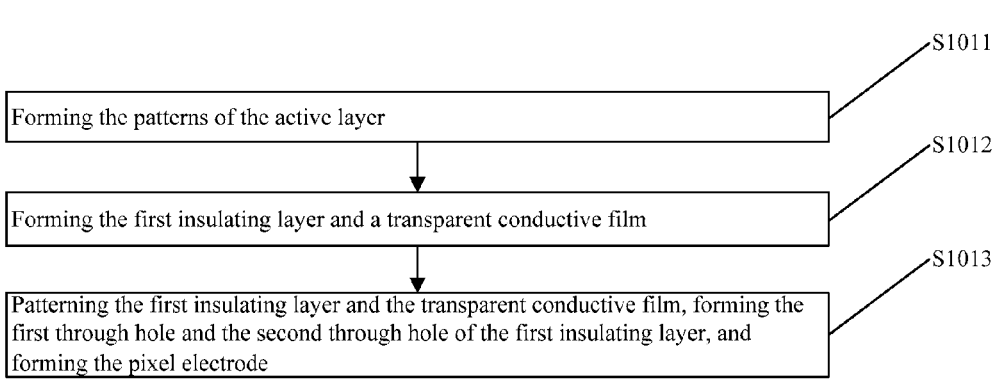
FIG. 9 is a flowchart 2 of the method for manufacturing the array substrate provided by an embodiment of the present invention.

In one embodiment of the present invention, as illustrated in FIG. 9, the step S101 may include the following steps.

Step S1011: forming the pattern of the active layer.

Figure 10:
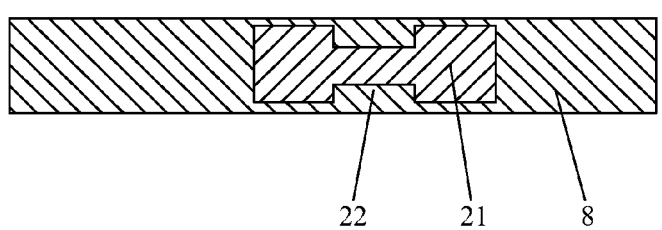
FIG. 10 is a plan view 3 of the array substrate provided by an embodiment of the present invention.

As illustrated in FIG. 10, on the basis of FIG. 8, the patterns of the active layer 21 are formed by the deposition of a semiconductor film via, for instance, plasma enhanced chemical vapor deposition (PECVD) and a patterning process.

Step S1012: forming the first insulating layer and a transparent conductive film.

Figure 11:
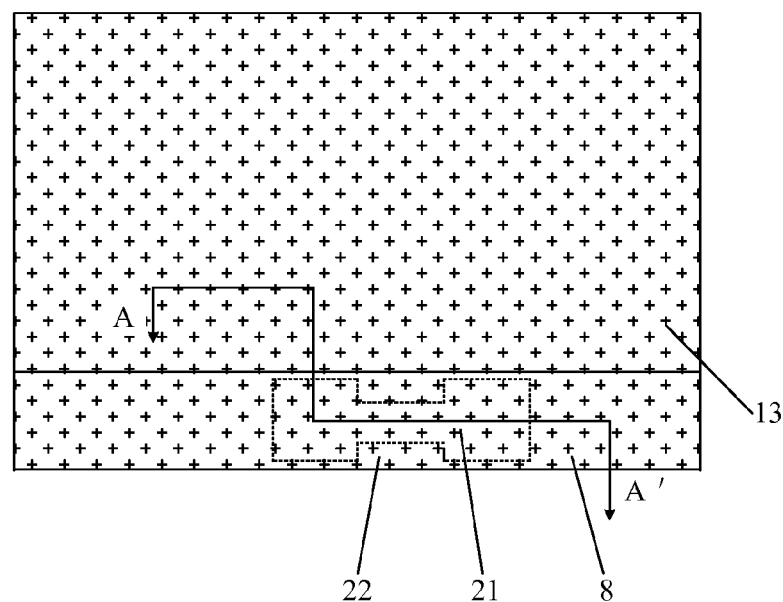
FIG. 11 is a plan view 4 of the array substrate provided by an embodiment of the present invention.

As illustrated in FIG. 11, on the basis of FIG. 10, a first insulating layer 4 is formed by coating or the like means at first, and the a transparent conductive film 13 is formed on the first insulating layer 4 by magnetron sputtering, thermal evaporation and other means. The first insulating layer 4 is a transparent insulating layer structure and is not shown in FIG. 11.

Figure 12:
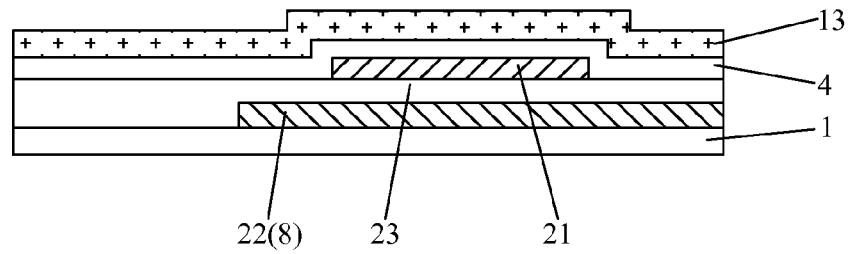
FIG. 12 is an A-A' sectional view of FIG. 11.

FIG. 12 is a sectional view of the array substrate as shown in FIG. 11. As seen from FIG. 12, the first insulating layer 4 is disposed beneath the transparent conductive film 13.

Step S1013: patterning the first insulating layer and the transparent conductive film, forming the first through hole and the second through hole of the first insulating layer, and forming the pixel electrode.

Figure 13:
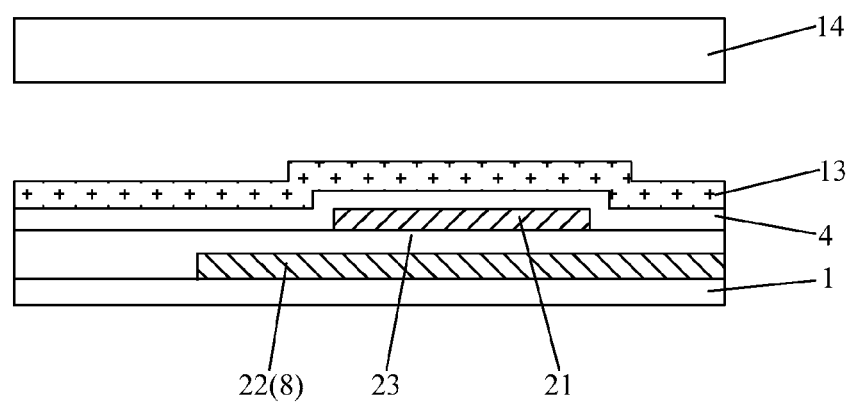
FIG. 13 is a schematic structural view 5 of the array substrate provided by an embodiment of the present invention.
Figure 14:
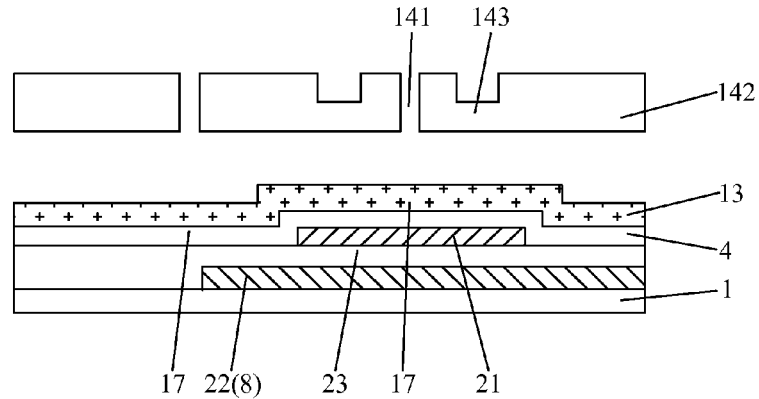
FIG. 14 is a schematic structural view 6 of the array substrate provided by an embodiment of the present invention.

For instance, as illustrated in FIG. 13, a photoresist layer 14 is formed above the transparent conductive film 13 by coating or the like means on the basis of FIG. 12 at first, and as illustrated in FIG. 14, a full exposure area 141, a non-exposure area 142 and a partial exposure area 143 are formed in the photoresist layer 14 via mask exposure.

Figure 15:
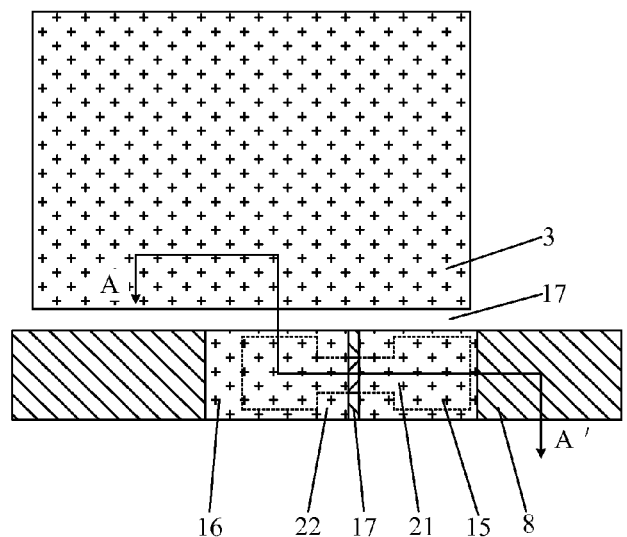
FIG. 15 is a plan view 5 of the array substrate provided by an embodiment of the present invention.
Figure 16:
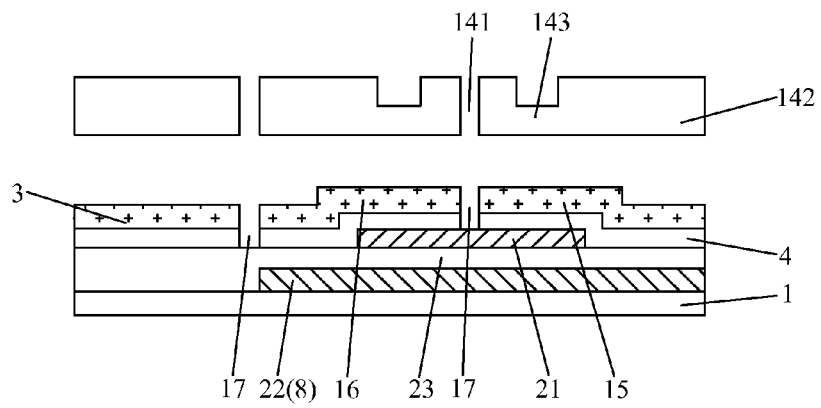
FIG. 16 is an A-A' sectional view of FIG. 15.

The transparent conductive film 13 and the first insulating layer 4 corresponding to the full exposure area 141 are etched by an etching process to form a pixel electrode 3, a first transparent conductive portion 15 and a second transparent conductive portion 16. Gaps 17 are formed among the pixel electrode 3, the first transparent conductive portion 15 and the second transparent conductive portion 16 by etching. The width of each gap 17 is, for instance, greater than 3 micrometers. Thus, the mutual insulation among the pixel electrode 3, the first transparent conductive portion 15 and the second transparent conductive portion 16 can be guaranteed. As illustrated in FIGS. 15 and 16, the first transparent conductive portion 15 and the second transparent conductive portion 16 respectively cover the region corresponding to the source electrode and the region corresponding to the drain electrode in the active layer 21.

It should be noted that the photoresist layer 14 is a transparent structure and is not shown in FIG. 15. Similarly, no further description will be given here.

Obviously, as illustrated in FIG. 16, a first insulating layer 4 is also disposed beneath the pixel electrode 3, the first transparent conductive portion 15 and the second transparent conductive portion 16.

Figure 17:
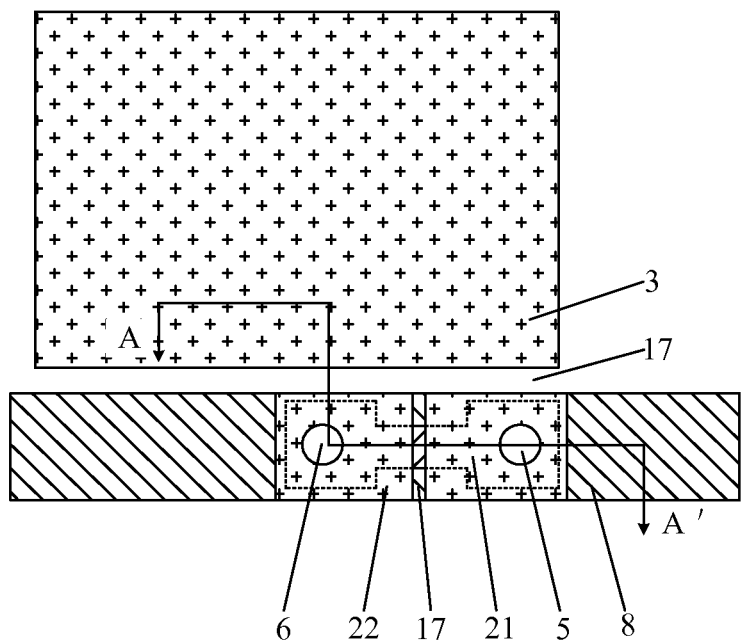
FIG. 17 is a plan view 6 of the array substrate provided by an embodiment of the present invention.
Figure 18:
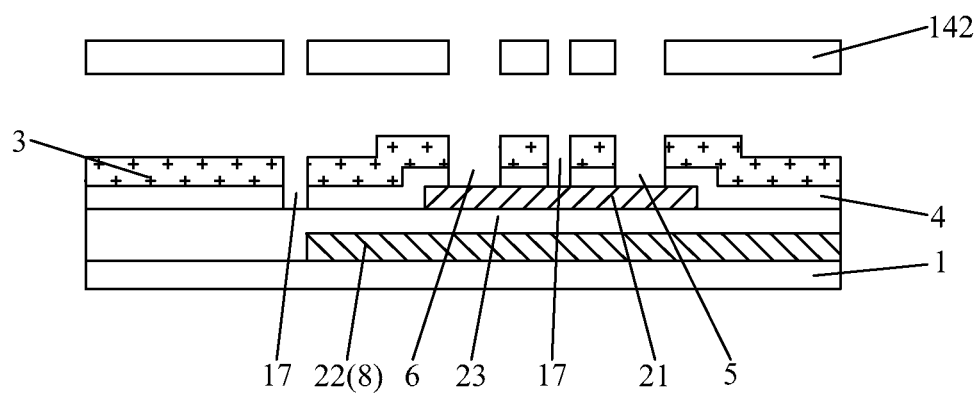
FIG. 18 is an A-A' sectional view of FIG. 17.

The photoresist layer of the partial exposure area 143 is removed by an ashing process, and the first insulating layer 4 and the transparent conductive film 13 corresponding to the first through hole 5 and the first insulating layer 4 and the transparent conductive film 13 corresponding to the second through hole 6 are exposed; and the first insulating layer 4 and the transparent conductive film 13 corresponding to the first through hole 5 and the second through hole 6 are etched in sequence by corresponding etching ways, as illustrated in FIGS. 17 and 18.

Figure 19:
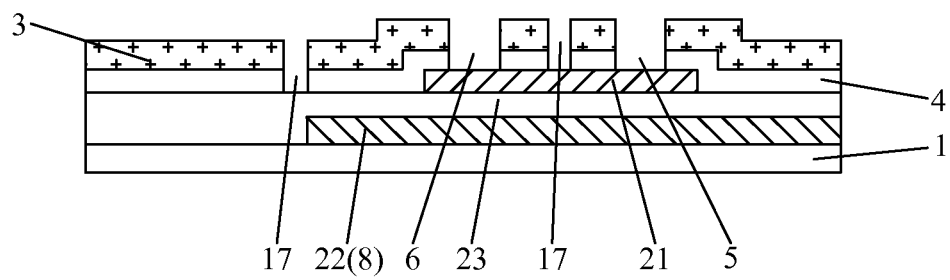
FIG. 19 is a schematic structural view 7 of the array substrate provided by an embodiment of the present invention.

Finally, the photoresist layer 14 of the non-exposure area 141 is removed, so that the pattern of the first insulating layer 4 and the patterns of the structures such as the pixel electrode 3 may be respectively formed in the same patterning process, as illustrated in FIG. 19.

Subsequently, the step S102 may be executed to form the source electrode 24 and the drain electrode 25 to complete the manufacturing process of the TFT 2. It should be noted that: if the patterns of the pixel electrode 3 and the first insulating layer 4 are formed by the manufacturing method including the steps S1011 to S1013, as corresponding regions of the active layer 21 are exposed by the gap 17 between the first transparent conductive portion 15 and the second transparent conductive portion 16 formed in the step S1013, as illustrated in FIG. 19, in order to prevent the etching liquid corresponding to the source electrode 24 and the drain electrode 25 from corroding the active layer 21 in the patterning process of the source electrode 24 and the drain electrode 25, because the etching liquid for metal copper almost has no effect on the active layers 21, in one embodiment, the source electrode 24 and the drain electrode 25 are made from metal copper.

Finally, the array substrate as shown in FIGS. 1 and 2 is formed.

In the embodiment of the present invention, as the first transparent conductive portion 15 is laid beneath the source electrode 24, the source electrode 24 is in parallel connection with the first transparent conductive portion 15, which is equivalent to reduce the resistance between the active layer 21 and the data line 7 and is more conducive to the transmission of electrical signals. Similarly, the second transparent conductive portion 16 is laid beneath the drain electrode 25, so that the resistance between the active layer 21 and the pixel electrode 3 can be reduced.

In one embodiment of the present invention, the data line 7 and the source electrode 24 and the drain electrode 25 may be formed in the same patterning process, namely the step of forming the patterns of the source electrode 24 and the drain electrode 25 of the TFT 2 includes: forming the data line 7 and the patterns of the source electrode 24 and the drain electrode 25 of the TFT 2.

The array substrate provided by the embodiment of the present invention may also be an ADS array substrate. Therefore, in one embodiment, the method for manufacturing the array substrate may further comprise: forming a second insulating layer and a common electrode. The second insulating layer is disposed between the pixel electrode and the common electrode.

For instance, the second insulating layer 9 and the common electrode 10 may be formed on the basis of the array substrate as shown in FIG. 2, and for instance, the structure of the array substrate as shown in FIG. 3 is formed; and the common electrode 10 and the second insulating layer 9 may also be formed before the gate insulating layer 23 and the structures such as the gate line 8 and the gate electrode 22 are formed, and for instance, the structure of the array substrate as shown in FIG. 4 is formed.

The array substrate provided by the embodiment of the present invention may also be a COA array substrate. Therefore, in one embodiment, the method for manufacturing the array substrate may further comprise: forming black matrixes and color filters.

For instance, in the embodiment of the present invention, as illustrated in FIG. 5, black matrixes 11 and color filters 12 may be formed on the base substrate 1 and below the structures formed in FIG. 2 to form a COA array substrate. Similarly, as illustrated in FIG. 6, the black matrixes 11 and the color filters 12 may also be formed on the base substrate 1 and below the layer structures of the array substrate as shown in FIG. 4 to form a COA-ADS array substrate. No further description will be given here.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410224631.1 submitted on May 26, 2014. The disclosure content of the Chinese patent application is incorporated by reference herein as part of the application.

The invention claimed is:

1. An array substrate comprising:
   a plurality of pixel unit regions arranged in an array, wherein each of the pixel unit regions includes:
      a thin-film transistor (TFT) and a pixel electrode;
      a first insulating layer is interposed between an active layer of the TFT and the pixel electrode and provided with a first through hole and a second through hole which respectively correspond to both ends of the active layer;
      a source electrode of the TFT is connected with the active layer through the first through hole; and
      a drain electrode of the TFT is lapped with the pixel electrode and connected with the active layer through the second through hole, and
   wherein the pixel electrode is interposed between the drain electrode and the active layer.

2. The array substrate according to claim 1, further comprising: data lines, wherein the data lines and the source electrodes and the drain electrodes of the TFTs are disposed on the same layer.

3. The array substrate according to claim 2, further comprising: a second insulating layer and a common electrode disposed above the pixel electrodes in sequence.

4. The array substrate according to claim 2, further comprising: a second insulating layer and a common electrode disposed below the TFTs in sequence.

5. The array substrate according to claim 2, further comprising: black matrices and color filters arranged corresponding to the pixel unit regions.

6. The array substrate according to claim 1, further comprising: a second insulating layer and a common electrode disposed above the pixel electrodes in sequence.

7. The array substrate according to claim 6, further comprising: black matrices and color filters arranged corresponding to the pixel unit regions.

8. The array substrate according to claim 1, further comprising: a second insulating layer and a common electrode disposed below the TFTs in sequence.

9. The array substrate according to claim 8, further comprising: black matrices and color filters arranged corresponding to the pixel unit regions.

10. The array substrate according to claim 1, further comprising: black matrices and color filters arranged corresponding to the pixel unit regions.

11. A display device, comprising the array substrate according to claim 1.

12. The array substrate according to claim 1, wherein the pixel electrode is formed with through holes respectively at the first through hole and the second through hole.

13. A method for manufacturing an array substrate, comprising:
    forming patterns of an active layer of a thin film transistor (TFT), a first insulating layer and a pixel electrode, in which the first insulating layer is provided with a first through hole and a second through hole which respectively correspond to both ends of the active layer; and
    forming patterns of a source electrode and a drain electrode of the TFT, in which the source electrode of the TFT is connected with the active layer through the first through hole and the drain electrode of the TFT is lapped with the pixel electrode and connected with the active layer through the second through hole,
    wherein the pixel electrode is interposed between the drain electrode and the active layer.

14. The method according to claim 13, wherein forming of the patterns of the active layer of the TFT, the first insulating layer and the pixel electrode includes:
    forming a pattern of the active layer;
    forming the first insulating layer and a transparent conductive film;
    patterning the first insulating layer and the transparent conductive films;
    forming the first through hole and the second through hole of the first insulating layer; and
    forming the pixel electrode.

15. The method according to claim 14, wherein forming of the patterns of the source electrode and the drain electrode of the TFT includes:
    forming a data line and the patterns of the source electrode and the drain electrode of the TFT.

16. The method according to claim 14, further comprising:
    forming a second insulating layer and a common electrode, wherein the second insulating layer is disposed between the pixel electrode and the common electrode.

17. The method according to claim 13, wherein forming of the patterns of the source electrode and the drain electrode of the TFT includes:
    forming a data line and the patterns of the source electrode and the drain electrode of the TFT.

18. The method according to claim 17, further comprising:
    forming a second insulating layer and a common electrode, wherein the second insulating layer is disposed between the pixel electrode and the common electrode.

19. The method according to claim 13, further comprising:
    forming a second insulating layer and a common electrode, wherein the second insulating layer is disposed between the pixel electrode and the common electrode.

20. The method according to claim 13, wherein the source electrode and the drain electrode are formed after the pixel electrode.

* * * * *